Figure 1:
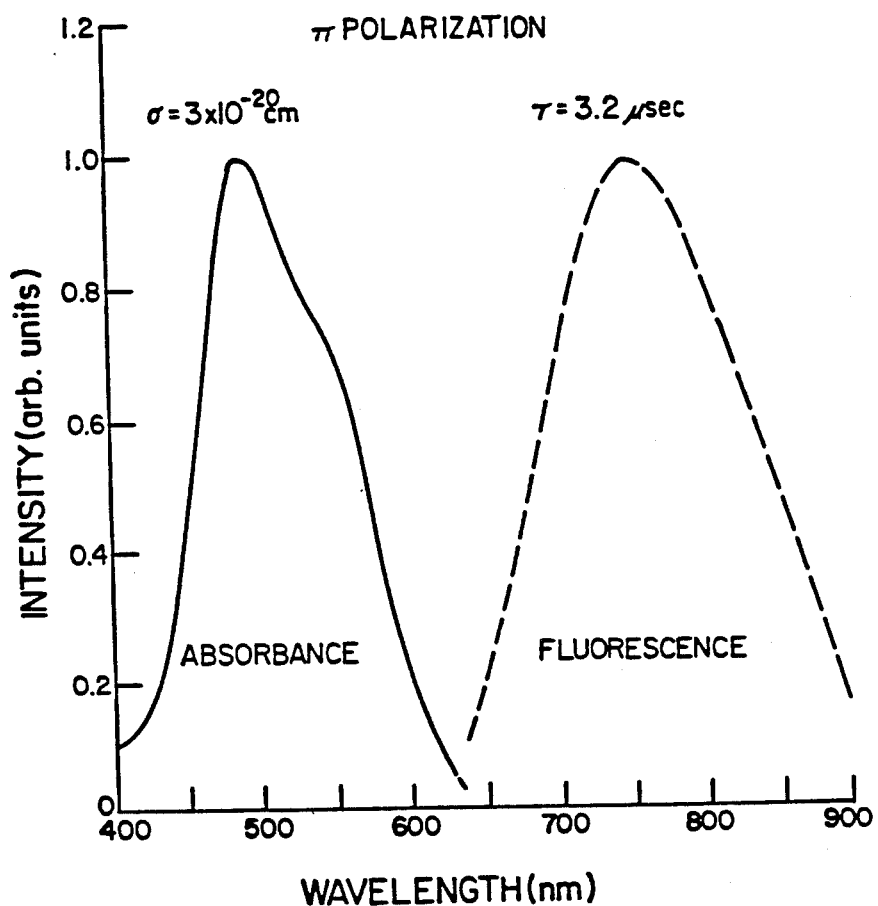

United States Patent [19]

Kokta

[11] Patent Number: 4,711,696

[45] Date of Patent: Dec. 8, 1987

[54] PROCESS FOR ENHANCING TI:AL$_2$O$_3$ TUNABLE LASER CRYSTAL FLUORESCENCE BY CONTROLLING CRYSTAL GROWTH ATMOSPHERE

[75] Inventor: Milan R. Kokta, Washougal, Wash.

[73] Assignee: Union Carbide Corporation, Danbury, Conn.

[21] Appl. No.: 838,605

[22] Filed: Mar. 11, 1986

Related U.S. Application Data

[63] Continuation-in-part of Ser. No. 736,000, May 20, 1985, abandoned.

[51] Int. Cl.$^4$ .............................................. C30B 15/10
[52] U.S. Cl. .............................. 156/617 SP; 156/606; 156/DIG. 61; 156/DIG. 75; 156/DIG. 89
[58] Field of Search ......... 156/606, 617 SP, DIG. 61, 156/DIG. 75, DIG. 89; 148/DIG. 40, DIG. 41

[56] References Cited

U.S. PATENT DOCUMENTS

| | | | |
|---|---|---|---|
| 3,608,050 | 9/1971 | Carmen et al. | 156/DIG. 61 |
| 3,715,194 | 2/1973 | Plooster | 156/DIG. 61 |
| 4,415,401 | 11/1983 | Wald et al. | 156/DIG. 89 |

Primary Examiner—John Doll
Assistant Examiner—R. Bruce Breneman
Attorney, Agent, or Firm—M. N. Reinisch

[57] ABSTRACT

Controlled growth atmosphere process for titanium doped tunable laser material to enhance lasing efficiency using carbon monoxide during melt formation.

7 Claims, 2 Drawing Figures

PROCESS FOR ENHANCING TI:AL2O3 TUNABLE LASER CRYSTAL FLUORESCENCE BY CONTROLLING CRYSTAL GROWTH ATMOSPHERE

This appication is a continuation-in-part application of U.S. Ser. No. 736,000, filed May 20, 1985, now abandoned, herein, incorporated by reference.

The present invention relates generally to the field of lasers. More particularly the present invention is related to a process for improving the lasing efficiency of tunable titanium doped sapphire, Ti:Al$_2$O$_3$.

Tunable solid state laser materials have been known to the art since the early 1960's, and Ti:Al$_2$O$_3$ was disclosed by P. F. Moulton (Laser Focus, May 1963) as a tunable laser material having an effective fluorescence tuning ranqe of 750 to 900 nm. The absorption spectra range for Ti:Al$_2$O$_3$ has been given as extending up to about 650 nm; however, it has been discovered that unless special precautions are taken in the course of processing titanium doped sapphire, Ti:Al$_2$O$_3$, the absorption spectra, while reaching a minimum value at about 650 nm, extends over the entire lasing (fluorescence) range with the undesirable result that lasing efficiency of the tunable Ti:Al$_2$O$_3$ material is significantly reduced.

Moreover, only relatively small amounts of titanium have been found useful in preparing Ti:Al$_2$O$_3$ material suitable for use as laser crystals. Even at concentrations of titanium of one percent in the melt, crystals prepared by conventional techniques have an absorption of light in the range of 650 to 1100 nm of over 12 percent per centimeter. Often the undesirable adsorption peaks at about 850 nm, in the mid range of the tunable band.

Accordingly, it is desired to improve the lasing efficiency of tunable titanium doped sapphire lasing material.

Processes have been disclosed for the preparation of sapphire lasing material. For instance, Plooster in U.S. Pat. No. 3,715,194 discloses the preparation of melt grown alumina crystals by providing an alumina melt and forming crystals from the melt. The patentee states that the atmosphere over the melt is to be inert to the melt "although it may be selectively made either slightly reducing or slightly oxidizing". (Column 3, lines 7 to 9). The patentee notes at column 8, lines 13 to 43, that the distribution coefficient of a Cr: Al$_2$O$_3$ system can vary widely depending upon the atmosphere in the crystal growing environment.

Plooster does not specifically disclose the effect of varying atmospheres in making titanium doped sapphire crystals let alone that the atmospheres in making titanium doped sapphire crystals can result in an improvement in the lasing efficiency of a titanium doped sapphire lasing material.

By this invention, processes have been provided that enhance the fluorescence of titanium-doped sapphire lasing materials. In the processes of this invention, the fluorescence of a tunable titanium-doped sapphire crystal is enhanced in the manufacture of the crystal, providing precursor mixtures for the crystal under a carbon monoxide-containing atmosphere which is being heated toward melt temperatures. Advantageously, the carbon monoxide is present before the mixture is liquified.

The crystals provided by the present invention are particularly useful as tunable laser materials having desirable fluorescent characteristics. An aspect of this invention relates to titanium-doped sapphire crystals which exhibit advantageous light transmittance characteristics over the range of 650 nm to 1100 nm. Particularly desirable laser crystals exhibit a light absorption within this range (often measured at 850 nm) (in percent per centimeter) less than 10, frequently less than 8, preferably less than 5, times the square of the weight percent of titanium in the melt for making the crystal. Thus, for a melt containing 1.5 weight percent titanium, this light absorption will be less than $(1.5)^2(10)$, or 22.5, percent per centimeter. Indeed, in processes in accordance with this invention, crystals made using about 1.5 weiqht percent titanium in the melt provided a light absorbance of about 3 to 4 percent per centimeter.

In summary, this invention relates to a method for making a titanium-doped sapphire crystal suitable for use as a laser material comprising:

(i) heating a mixture of a doping amount of TiO$_2$ and to Al$_2$O$_3$ provide a melt under a non-reactive atmosphere, and (ii) forming from said melt and under a non-reactive atmosphere, a Ti:Al$_2$O$_3$ crystal in which during the process of heating the mixture to make the melt but below temperatures under which undue thermal degradation of carbon monoxide occurs, providing in said non reactive atmosphere sufficient carbon monoxide such that the crystal fluorescence of the resulting crystal is enhanced.

The carbon monoxide is present prior to the solid phase mixture containing the titanium and alumina precursor materials entering the liquid phase. While not wishinq to be bound by theory, it is believed that the benefits of the carbon monoxide are principally provided while the titanium-containing species are in the solid phase. Thus, the carbon monoxide should be present during the heating of the solid phase mixture for a sufficient time prior to liquification of the mixture that the desired enhanced fluorescence is obtained. Often, the temperature during the presence of the carbon monoxide is at least about 800° C. and may range from about 800° C. to about 1600° C.

While the mixture is a melt and during the formation of the crystal, it is preferred that the mixture be maintained under a slightly reducing atmosphere. Because of the degradation of carbon monoxide and the elevated temperatures of the melt, it is usually preferred to use hydrogen as the reducing agent in the non-reactive atmosphere. When the crystal has been formed, it is then cooled and at least at temperatures above about 1600° C., the cooling crystal is maintained in a non-reactive atmosphere which preferably contains about 5 ppm to 1% by volume hydrogen; however greater concentrations of hydrogen may be used, e.g., 5 ppm to 20 volume percent but are usually avoided in view of safety concerns.

Generally, the carbon monoxide is provided in an amount of about 5 ppm to 1% by volume in the non-reactive atmosphere. Greater carbon monoxide concentration may be useful, e.g., 5 ppm to 20 volume percent, but are usually avoided in view of safety concerns considering the temperatures employed and the potential for gas leaks. Frequently, at temperatures of from about 1500° C. to 1700° C., carbon monoxide is removed from the atmosphere surrounding the melt.

Figure 2:
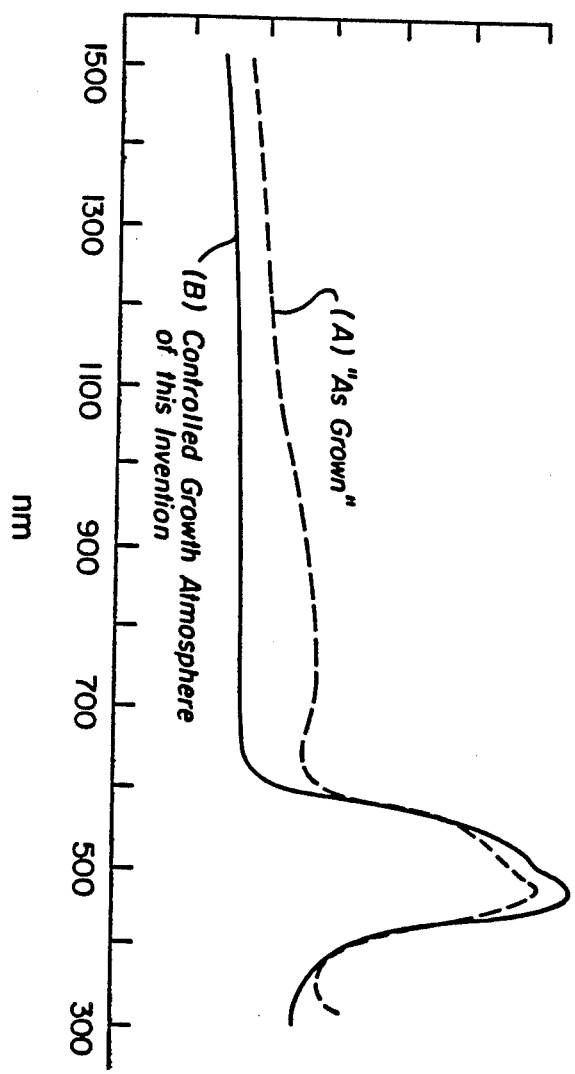

FIG. 1 shows a prior art illustration of absorption and fluorescence spectra for Ti:Al$_2$O$_3$ and FIG. 2 shows absorption spectra for Ti:Al$_2$O$_3$ processed by the crystal growth technique of the present invention in comparison with absorption spectra for Ti:Al$_2$O$_3$ which has not been processed by the crystal growth technique of the present invention.

In the frequent practice of the present invention a crystal of titanium doped sapphire (Al$_2$O$_3$), made from a melt containing from about 0.03 to 2.0, often, 0.03 to 1.0 weight percent of titanium, is prepared by heating a mixture of high purity TiO$_2$ (less than 50 ppm of Cr, Fe, Si, Ca) and high purity Al$_2$O$_3$, e.g., sapphire "crackle" containing less than 100 ppm of impurities such as Si, Cr, Fe, and Mg, to provide a melt at a temperature in the range of about 2050° C. to 2080° C.; a Ti:Al$_2$O$_3$ crystal is formed from the melt, e.g., by the well known Czochralski technique and the crystal is cooled to room temperature. The foregoing steps are conducted in a non-reactive ambient atmosphere, e.g., nitrogen, argon or other inert gases, with from about 5 ppm to 1% by volume of reducing gas (greater concentrations may be used but are typically not employed for safety considerations) being provided in the ambient gas atmosphere at temperatures above 800° C. The reducing gas can be hydrogen; the carbon monoxide used can also be used in accordance with this invention as the reducing gas at temperatures between 800° C. and 1600° C., being replaced by hydrogen for the higher temperatures above 1600° C. up to the peak temperature for crystal formation, e.g., 2050° C. The replacement of carbon monoxide at these high temperatures is required to avoid carbon contamination due to decomposition of carbon monoxide.

The boule of Ti:Al$_2$O$_3$ thus prepared is clear, has a deep pink color, is essentially free of scattering centers (i.e., bubbles, inclusion, and point defects) and has an absorption spectra represented by (B) of FIG. 2, as compared to a boule prepared using only nitrogen ambient atmosphere which contains a large number of scattering centers, is of marginal clarity, has a color of purple-blue hue and an absorption spectra represented by dotted lines (A) of FIG. 2 which extends completely across the wave length of the fluorescence spectra in the prior art diagram of FIG. 1. Consequently, it can be seen that the lasing efficiency of the tunable spectra of the Ti doped sapphire material is enhanced by the controlled ambient atmosphere of the present invention of scattering centers in the boule by the use of a controlled reducing ambient atmosphere. The lasing efficiency for the material of (B) is on the average from 2 to 29% more than that of (A), and the material of (B) shows by EPR (electron paramagnetic resonance) and absorption spectroscopical analysis an increased Ti$^{+3}$ content as compared to (A).

The following example will further illustrate the present invention.

EXAMPLE 1

A charge was prepared from TiO$_2$ powder and Al$_2$O$_3$ "crackle". The impurity content of the above materials was determined to be
Al$_2$O$_3$ less than 100 ppm impurities
TiO$_2$ less than 50 ppm impurities
A charge was prepared as follows:
TiO$_2$ 22 grams
Al$_2$O$_3$ 4000 grams The materials were charged to an iridium crucible located in a "bell jar" which was sealed against atmospheric leaks. A flow (40 CFM) of nitrogen with less than 10 ppm O$_2$ was used as the ambient atmosphere within the "bell jar". An induction coil was used to heat the charge over a period of 8 hours from room temperature to a temperature in the range of 2050° C. to 2080° C. which was maintained for two hours. At the end of the two-hour period the charge was observed to be melted. A sapphire (Al$_2$O$_3$) seed crystal mounted on a rotatable rod was lowered into the melt, rotated at 15 rpm and raised over a period of 300 hours to obtain a boule of Ti:Al$_2$O$_3$ crystal of 1½ inch diameter and 3 inches in length. In the temperature range of 750° to 800° C. the initial nitrogen ambient atmosphere was replaced by a carbon monoxide containing atmosphere (1% by volume CO; 99% by volume N$_2$) and at the temperature of 1500° C. the carbon monoxide ambient atmosphere was replaced by a nitrogen atmosphere containing 1% by volume hydrogen. The boule produced was cooled to 25° C. under the hydrogen containing atmosphere and was analyzed at room temperature and found to have a Ti$^{3+}$ content of about 0.08% to 0.1% atomic and was pink in color and was essentially free of scattering centers. The absorption spectra corresponded to (B) of FIG. 2 and its lasing efficiency increase due to the use of the CO and H$_2$ reducing atmosphere.

EXAMPLES 2 TO 6

In these examples, the procedures set forth in Example 1 were substantially followed with the exceptions as noted in Table I below. Table I also reports the performance of the crystal material.

TABLE I

| Example | Melt Composition, g | | Absorbance at 650 nm, percent per centimeter |
|---|---|---|---|
| | Al$_2$O$_3$ | TiO$_2$ | |
| 2 | 4840 | 48 | |
| 3 | 4850 | 72 | Run inconclusive** |
| 4* | 5650 | 28.3 | 3 |
| 5* | 6152 | 62.2 | 12.5 |
| 6* | 5489 | 82 | 24 |

*Comparative Example, H$_2$ used instead of CO.
**3 to 4% per centimeter is estimated.

What is claimed is:

1. A method for making a Ti doped Al$_2$O$_3$ crystal suitable as a laser material comprising:
   (i) making a solid phase mixture of a doping amount of TiO$_2$ in Al$_2$O$_3$ to provide a melt under a non-reactive atmosphere;
   (ii) introducing carbon monoxide into said non-reactive atmosphere while the melt is in the solid phase;
   (iii) purging said non-reactive atmosphere of carbon monoxide and its reactive gaseous products prior to liquifaction of said solid phase mixture;
   (iv) introducing a reducing agent other than carbon monoxide into said non-reactive atmosphere as a substitute for said carbon monoxide; and
   (v) heating said melt to a sufficiently high temperature under said non-reactive atmosphere to form a Ti:Al$_2$O$_3$ crystal.

2. The method of claim 1 wherein said reducing agent in step (iv) includes H$_2$ in an amount sufficient to reduce free oxygen present at the melt.

3. The method of claim 3 wherein the crystal formed in step (v) is cooled and at least above a temperature of about 1600° C., the cooling crystal is maintained in a non-reactive atmosphere containing hydrogen.

4. The method of claim 3 wherein the TiO$_2$ is of high purity and the Al$_2$O$_3$ contains less than 100 ppm of impurities.

5. The method of claim 1 wherein the melt is heated to a temperature of about 2050° C. to 2080° C.

6. The method of claim 5 wherein the crystal is formed by the Czochralski technique.

7. The method of claim 1 wherein the solid phase mixture contains from about 0.03 to 1.0 weight percent titanium.

* * * * *